United States Patent [19]
Swanson et al.

[11] Patent Number: 6,103,590
[45] Date of Patent: Aug. 15, 2000

[54] SIC PATTERNING OF POROUS SILICON

[75] Inventors: Leland S. Swanson; Douglas A. Prinslow, both of McKinney, Tex.

[73] Assignee: Texas Instruments Incorporated, Dallas, Tex.

[21] Appl. No.: 09/207,939

[22] Filed: Dec. 9, 1998

Related U.S. Application Data

[60] Provisional application No. 60/069,522, Dec. 12, 1997.

[51] Int. Cl.$^7$ .................................................. H01L 21/44
[52] U.S. Cl. ......................................... 438/409; 439/960
[58] Field of Search ..................................... 438/409, 960

[56] References Cited

U.S. PATENT DOCUMENTS

| | | | |
|---|---|---|---|
| 4,063,901 | 12/1977 | Shiba ........................................ | 438/960 |
| 5,023,200 | 6/1991 | Blewer et al. ........................... | 438/409 |
| 5,482,598 | 1/1996 | Isaka et al. .............................. | 438/960 |
| 6,017,773 | 1/2000 | Fauchet et al. .......................... | 438/960 |

OTHER PUBLICATIONS

J. Electrochem. Soc., vol. 140, No. 3, Mar. 1993 © The Electrochemical Society, Inc. "Low Pressure Chemical Vapor Deposition of Silicon Carbide from Diethylsilane," pp. 851–854 (J.M. Grow, R.A. Levy, Y.T. Shi and R.L. Pfeffer).

N.H. Elsevier, Materials Letters 23 (1995), "Photolithographic Patterning of Porous Silicon Using Silicon Nitride and Silicon Carbide Masks," pp. 209–214 (H Wang, B. Welker, Y. Gao, J.F. Federici, R.A. Levy).

J. Electrochem. Soc., vol. 140, No. 10, Oct. 1993 © The Electrochemical Society, Inc. "Low Pressure Chemical Vapor Deposition of Silicon Carbide from Ditertiarybutylsilane," pp. 3001–3007 (J.M. Grow, R.A. Levy, M. Bhaskaran,H.J. Boeglin and R. Shalvoy).

N.H. Elsevier, Thin Solid Films 276 (1996), "Formation of Porous Silicon on Patterned Substrates," pp. 257–260 (M. Krüger, R. Arens–Fischer, M. Thönissen, H. Münder, M.G. Berger, H. Lüth, S. Hilbrich and W. Theiss).

N.H. Elsevier, Thin Solid Films 255 (1995), "P Wells Made of Porous Silicon for Power Devices: Determination of the Formation Steps," pp. 321–324 (P. Déhu, A. Senes and F. Miserey).

Mat. Res. Soc. Symp. Proc. vol. 380, 1995 Materials Research Society, "Manufacturing of Submicron Light–Emitting Porous Silicon Areas for Miniature LEDs" pp. 73–78 (S.P. Duttagupta, C. Peng, L. Tsybeskov and P.M. Fauchet).

Mat. Res. Soc. Symp. Proc. vol. 358, 1995 Materials Research Society, "Micron–Size and Submicron–Size Light–Emitting Porous Silicon Structures," pp. 647–652 (S.P. Duttagupta, P.M. Fauchet, C. Peng, S.K. Kurinec, K. Hirschman and T.N. Blanton).

(List continued on next page.)

*Primary Examiner*—Olik Chaudhuri
*Assistant Examiner*—Anh Duy Nai
*Attorney, Agent, or Firm*—Jacqueline J. Garner; W. James Brady III; Frederick J. Telecky, Jr.

[57] ABSTRACT

A method of selectively forming porous silicon regions (106) in a silicon substrate (100). A masking layer (104) of SiC is deposited by PECVD over the substrate (100) using an organosilicon precursor gas such as trimethylsilane, silane/methane, or tetramethylsilane at a temperature between 200–500° C. The masking layer (104) of SiC is then patterned and etched to expose the region of the substrate (100) where porous silicon is desired. An anodization process is performed to convert a region of the substrate to porous silicon (106). The SiC masking layer (104) withstands the HF electrolyte of the anodization process with little to no degradation.

24 Claims, 7 Drawing Sheets

OTHER PUBLICATIONS

Appl. Phys. Lett. 64 (11), Mar. 14, 1994 © 1994 American Institute of Physics "Selective–Area Room Temperature Visible Photoluminescence from SiC/Si Heterostructures," pp. 1419–1420 (A.J. Steckl, J.N. Su, J. Xu, J.P. Li, C. Yuan, P.H. Yih and H.C. Mogul).

N.H. Elsevier, Thin Solid Films 255 (1995), "Sub–Micrometre Luminescent Porous Silicon Structures Using Lithography Patterned Substrates," pp. 329–333 (A.G. Nassiopoulos, S. Grigoropoulos, L. Canhamer, A. Halimaoui, I. Berbezier, E. Gogolides, D. Papadimitriou).

Jpn. J. Appl. Phys. vol. 35 (1996) Part 2, No. 7B, July 15 "Utilization of GaAs Masking Layers for Formation of Patterned Porous Silicon," pp. L865–L868 (Ming–Kwei Lee, Cheng–Chung Hu and Yu–Hsiung Wang).

N.H. Elsevier, Materials Letters 23 (1995) "Growth Kinetics and Characterization of Low Pressure Chemically Vapor Deposited $Si_3N_4$ Films from $(C_4H_9)_2SiH_2$ and $NH_3$" pp. 187–193 (J.M. Grow, R.A. Levy, X. Fan and M. Bhaskaran).

SIC PATTERNING OF POROUS SILICON

This application claims priority under 35 USC §119 (e) (1) of provisional application Ser. No. 60/069,522, filed Dec. 12, 1997.

FIELD OF THE INVENTION

The invention is generally related to the field of forming porous silicon areas in semiconductor devices and more specifically to patterning techniques for forming the porous silicon areas.

BACKGROUND OF THE INVENTION

Porous silicon (PS) has a low dielectric constant and high resistivity which make it useful for various applications. Some reported applications include: isolation of power devices from other circuitry and optoelectronics/photoluminesence. PS is formed by anodic oxidation of a silicon wafer in a solution of hydrofluoric acid and methanol. Uniform, thick (100 $\mu$m) films having a specular surface can be produced in 15 minutes. The PS film structure consists of interconnected pores in a single crystal silicon matrix which retains the orientation of the silicon wafer. The pore fraction is a function of the anodization conditions and typically ranges from 30% to 50%. The pore structure of PS is determined by the doping level of the starting silicon wafer. In degeneratively doped n-type or p-type silicon, the structure consists of many long pores running perpendicular to the silicon wafer surface with many small "buds" on the sides of the pores which can result in branching. In lightly doped n-type or p-type silicon, the pore structure consists of an apparently random, interconnected distribution of voids. For a pore fraction of 50%, the size of the pores in lightly doped material is in the 50 Å range, while those in degeneratively doped material are around 150 Å. Once the sidewalls of a pore have formed, they are remarkably resistant to further anodic attack. At the start of anodization, inhomogenities in the region of the semiconductor-electrolyte interface result in localization of the current flow and the initiation of pores. The silicon between the pores is depleted and is therefore highly resistive (>$10^5$ Ohm cm) compared with the electrolyte and the bulk silicon. This results in preferential current flow down the electrolyte in the pores causing the reaction to occur only at the pore tips.

The construction of a commonly employed chamber is illustrated in FIG. 1. The silicon wafer 10 separates the front 12 and rear 14 half cells, each having a platinum electrode 16 and pumped supply of electrolyte 18. The PS film forms on the anode side of the wafer; the silicon is cathodic in the back half cell and does not react. The most important variables affecting the PS structure are (1) substrate doping type and level; (2) HF concentration (10–48%); and (3) current density (typically 1–100 mA/cm$^2$). For a fixed substrate resistivity, similar film porosity can be produced using various combinations of HF concentration and current density. Porosity generally increases with increasing current density and decreasing HF concentration. Porous silicon has a high internal surface area, but the impurities found on these surfaces (oxygen, carbon, fluorine, and hydrogen) should not represent a significant problem for subsequent front-end processing.

Selective anodization has been demonstrated using various masking materials. Two approaches have been used to define the PS regions: (1) ion irradiation to inhibit anodization and (2) conventional photolithography combined with various masking layers. The use of ion irradiation damages the single crystal silicon regions; this damage must be removed by subsequent processing. For conventional photolithography and masking layers, it is difficult to find a masking material that will not erode in the presence of the HF during the anodization process, which may last on the order of 15 minutes, and that is compatible with standard processing. Several masking materials have been proposed. These include silicon nitride, MOCVD GaAs, RTCVD SiC, and LPCVD SiC. It is not clear whether silicon nitride of reasonable thickness can withstand HF for the duration required for thick porous silicon regions. While GaAs and SiC can withstand HF, the proposed MOCVD GaAs, RTCVD SiC, and LPCVD SiC processes occur at high temperatures (600–1300° C.). These high temperatures present process integration problems. Therefore, a selective anodization process that is compatible with high volume production remains to be demonstrated.

SUMMARY OF THE INVENTION

A method of selectively forming porous silicon regions in a silicon substrate is disclosed herein. A layer of SiC is deposited by PECVD over the substrate using a silane/methane, triethylsilane, tetramethylsilane or other organosilicon precursor gas at a temperature between 200–500° C. The layer of SiC is then patterned and etched to expose the region of the substrate where porous silicon is desired. An anodization process is performed to convert a region of the substrate to porous silicon.

An advantage of the invention is providing a low temperature process for selectively forming porous silicon regions.

Another advantage of the invention is providing a masking material that is compatible with the anodization processes and is not removed by the HF used in the anodization process.

These and other advantages will be apparent to those of ordinary skill in the art having reference to the specification in conjunction with the drawings.

DETAILED DESCRIPTION OF THE EMBODIMENTS

The invention is a process for selectively forming areas of porous silicon in a substrate after the formation of transistors in the substrate. As such, the invention is believed to be very beneficial for RF (radio frequency) applications by isolating passive RF components from the substrate both in an IC and an integrated Si PC board as will be discussed herein below.

The production of porous silicon (PS) involves a wet anodic etch process in a bath of a very acidic electrolyte. The electrolyte is typically a combination of HF, H2O, and a surfactant such as ethanol or methanol. The pH level is often less than 1. For selective PS formation a masking step is necessary to prevent previously grown structures (i.e., transistors) from being removed from the surface during anodization.

The key aspect of the invention is in the choice and formation of the masking layer. The problem is that typical masking materials such as photoresist and silicon nitride have poor stability in the presence of HF. Therefore, the invention uses silicon carbide (SiC) deposited using a new process that is compatible with production-level IC processing.

Figure 1:
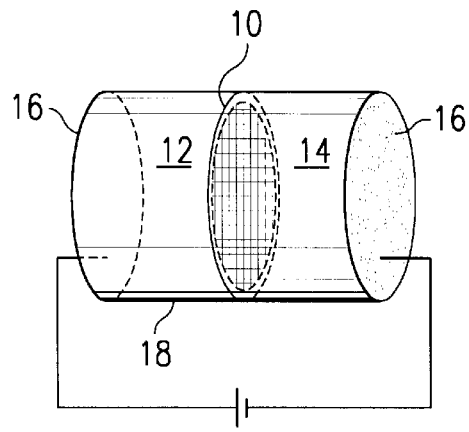
FIG. 1 is a prior art schematic of an anodization cell used to form porous silicon layers.
Figure 2:
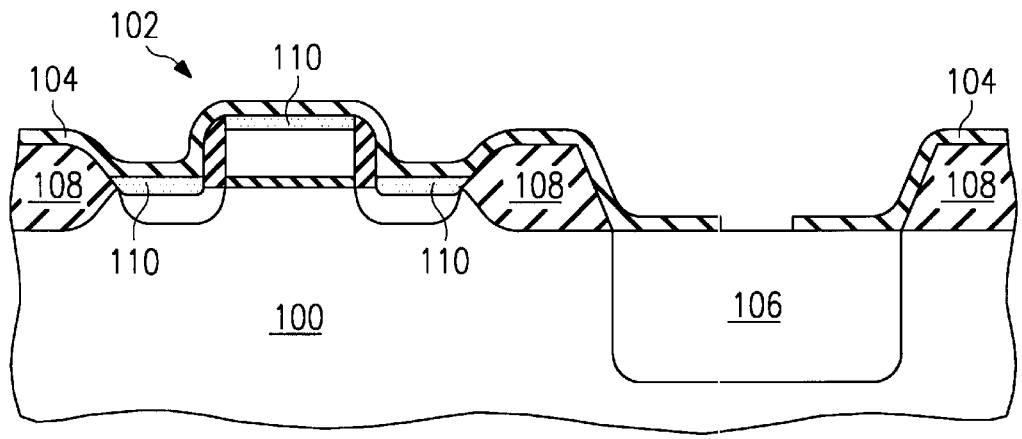
FIG. 2 is a cross-sectional diagram of a substrate having a SiC masking layer according to the invention.
Figure 3A:
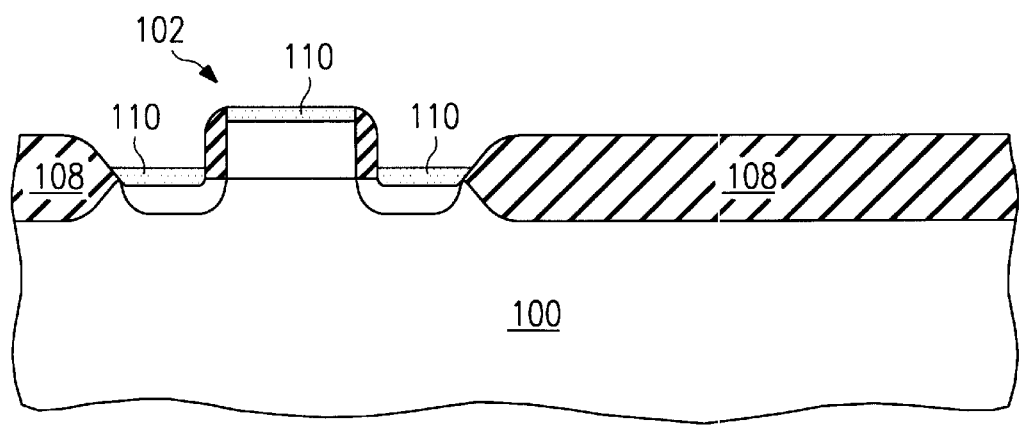
FIGS. 3A–3J are cross-sectional diagrams of a substrate having porous silicon areas according to a first embodiment of the invention at various stages of fabrication.

FIG. 2 shows a cross-section of a substrate 100 having transistors 102 formed therein. A masking layer 104 is located over the substrate 100 and transistors 102 except in areas where PS 106 is desired. Masking layer 104 comprises an amorphous-SiC:H layer deposited using an organosilicon gas such as silane/methane, trimethylsilane, or tetramethylsilane, PECVD (plasma-enhanced chemical vapor deposition). Masking layer 104 is carbon rich and a 500 Å thick film can withstand an HF electrolyte environment for at least 18 hrs without observable degradation. Substrate temperatures need not exceed 350° C. and are typically between 250° C. and 350° C. depending on the desired film properties. The deposition rate is greater than 200 Å/min with good step coverage. Film stress can be adjusted from −100 to +200 MPa by varying the ambient pressure. Thus, a masking layer comprising an amorphous-SiC:H layer deposited using an organosilicon precursor gas PECVD process overcomes problems with the other prior art masking materials of withstanding the HF environment and, by using lower deposition temperatures, overcomes process integration problems with prior art SiC deposition processes.

a process for forming selective PS areas according to a first embodiment of the invention will now be discussed in further detail. In this embodiment, the SiC masking layer 104 is deposited after the transistor silicide process and is not removed from the regions through which contacts will be made. Referring to FIG. 3A, the device is processed through isolation regions 108 and transistor 102 formation. Transistors 102 are fabricated through silicide 110 formation and anneal (Ti or W). Isolation regions 108 are shown as field oxide regions. However, they may alternatively be another type of isolation such as shallow trench isolation STI. For STI, process through STI planarization and etch the polish stop layer, leaving the underlying oxide layer.

If desired an optional oxide layer (not shown) may be deposited at this point. This oxide layer may be deposited by, for example, PETEOS or LPCVD TEOS to a thickness on the order of 5000–10,000 Å.

Figure 3B:
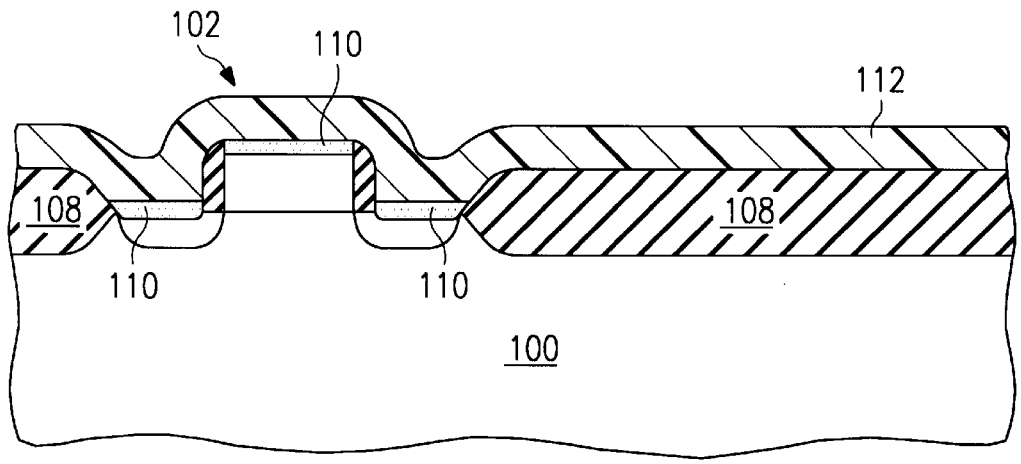
Figure 3C:
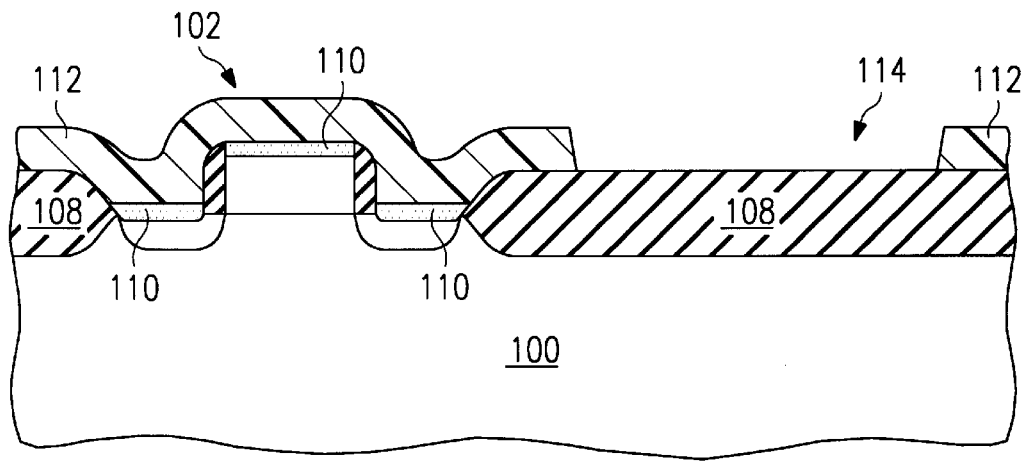
Figure 3D:
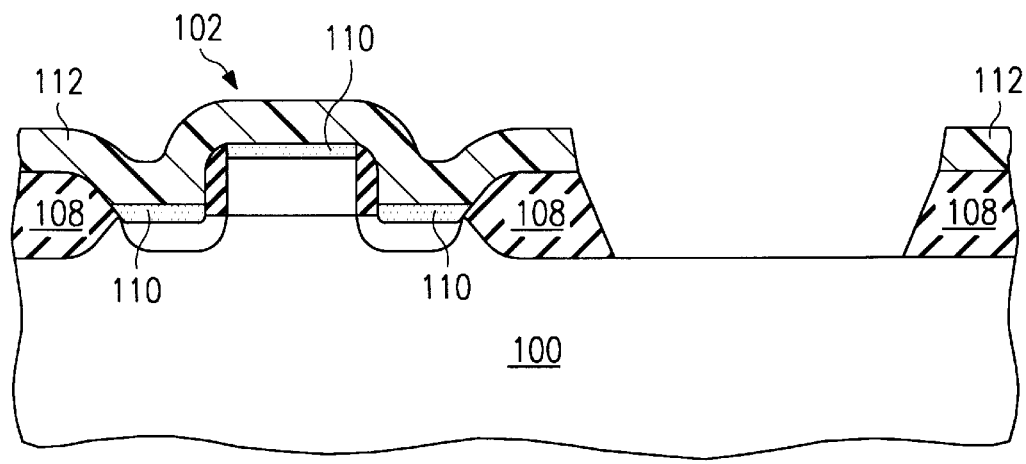

Next, a resist layer 112 is formed over the surface as shown in FIG. 3B. The resist layer 112 is patterned as shown in FIG. 3C to expose an area 114 of isolation region 108. Area 114 is located over the desired PS site. Then, the oxide of isolation regions 108 is etched leaving sloped sidewalls on the order of 45°, as shown in FIG. 3D. This may, for example, be accomplished in one of the following two ways: (1) isotropic plasma etch using $CF_4/O_2$ or its equivalent or (2) HF deglaze. Resist layer 112 is then removed using standard ash/cleanup processes.

It will be apparent to those of ordinary skill in the art that the above oxide pattern and etch steps may alternatively be performed prior to transistor formation.

A p+ diffusion of boron or similar dopant may be performed prior to the transistor formation to convert the p− epi to p+ w/resistivity on the order of 0.01 Ω-cm. If necessary, a deglaze to remove the boron or similar dopant contaminated oxide is then performed and a pad oxide is re-grown to a thickness on the order of 100–500 Å.

Figure 3E:
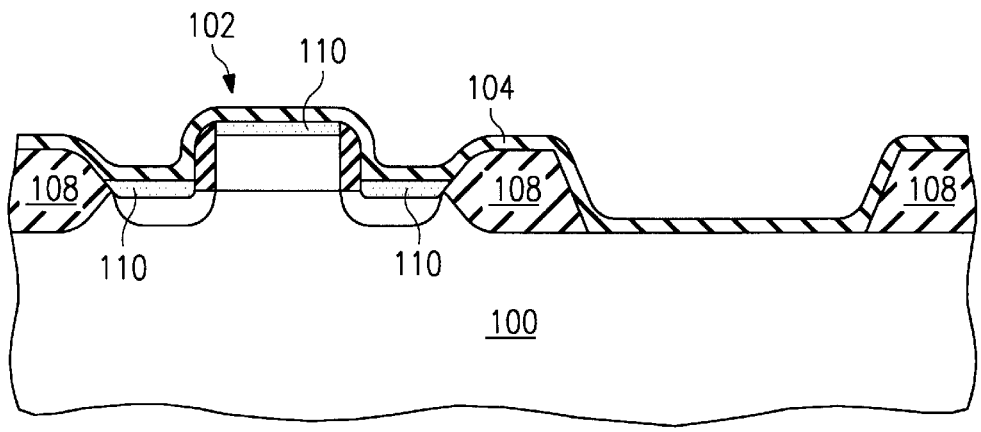

Referring to FIG. 3E, a masking layer 104 of a-SiC:H is deposited over the structure. Layer 104 may typically have a thickness in the range of 1000 Å to 5000 Å. The following process may be used: PECVD using silane/methane, trimethylsilane, tetramethylsilane or other organosilicon precursor gas and Ar or He as carrier gas. The pressure may be on the order of 5 Torr. The gas flow may be in the range of 500–5000 sccm. RF power density may be on the order of 2 W/cm$^2$ (13.56 MHz). The substrate temperature may be in the range of 200–500° C. If desired, a double deposition step (using the same conditions) may be used to reduce defects.

Figure 3F:
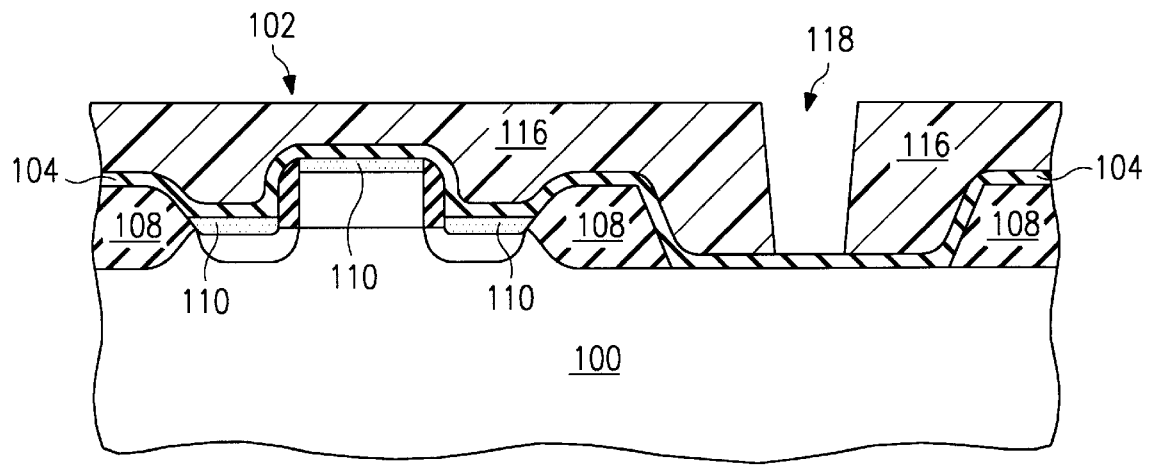

Next, a second resist mask 116 is formed over the SiC masking layer 104. Second resist mask 116 exposes a portion 118 of SiC masking layer 104 approximately in the center of where the PS region is desired, as shown in FIG. 3F. The exposed portion 118 is significantly smaller than the width of the desired PS region. The relationship between the size of portion 118 and the desired PS region is optimized based on the PS formation process parameters.

Figure 3G:
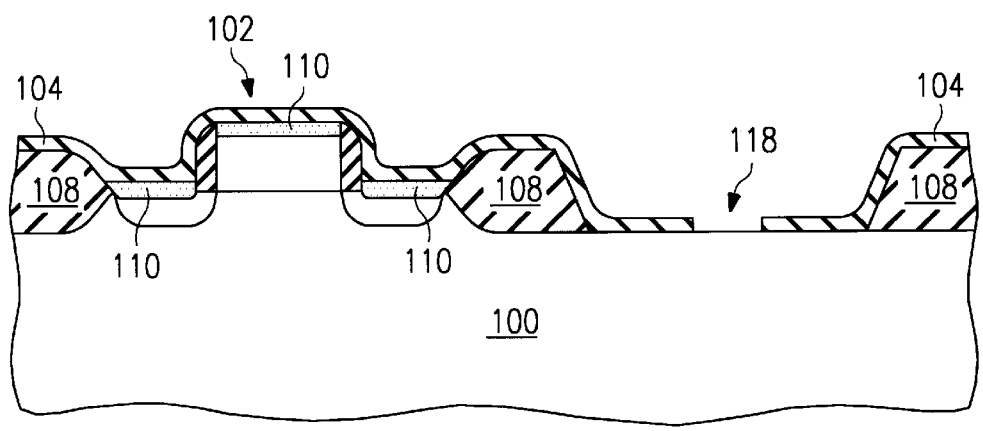

Referring to FIG. 3G, the exposed portion 118 of SiC masking layer 104 is removed. Methods for removing SiC are known in the art. The following are some exemplary methods for removing portion 118 of SiC masking layer 104. (1) $Cl_2$ based etch [Selectivity of the etch, with this gas, down to the oxide should not be an issue. Removal rate for SiC relative to $SiO_2$ of 10:1 has been achieved.] using a chamber pressure: ~300 mTorr (gas flow 10–50 sccm) and RF Power density ~0.5–1 W/cm$^2$ (13.56 MHz); (2) $CF_4/O_2/H_2$ based etch using an $O_2$ fraction 0–90%, $H_2$ flow 0–20 sccm, (fluorinated-$O_2$ gas flow 10–50 sccm), chamber pressure; ~10–50 mTorr, and RF Power density 0.5–1 W/cm$^2$ (13.56 MHz); (3) $SF_6/O_2/H_2$ based etch using $O_2$ fraction 0–90%, $H_2$ flow 0–20 sccm, (fluorinated-$O_2$ gas flow 10–50 sccm), chamber pressure; ~10–50 mTorr, and RF Power density ~0.5–1 W/cm$^2$ (13.56 MHz); and (4) $CHF_3/CF_4/Ar/O_2/H_2$ based etch using an $O_2$ fraction 0–50%, $H_2$ flow 0–100 sccm, (fluorinated-Ar gas flow 50–200 sccm), chamber pressure: ~10–50 mTorr, and RF Power density ~0.5–1 W/cm$^2$ (13.56 MHz). Second resist layer 118 is then removed.

Figure 3H:
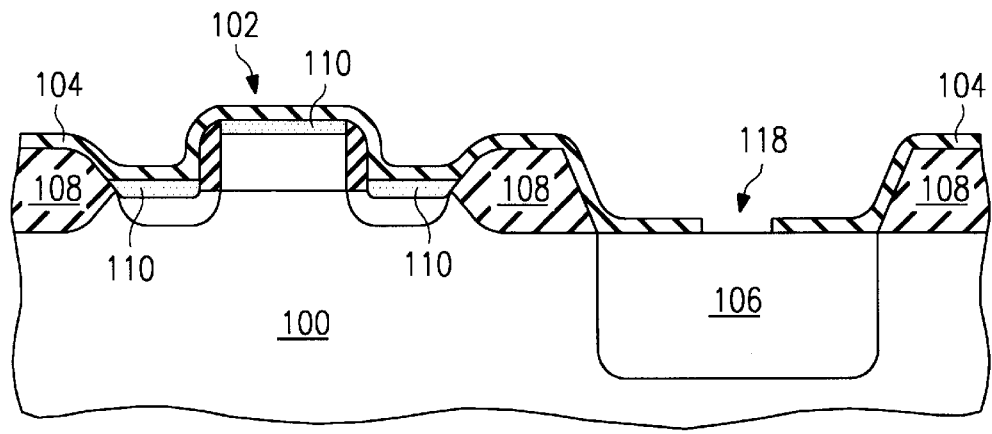

Next, the PS regions 106 are formed by anodization, as shown in FIG. 3H. The thickness of PS region 106 may vary between 10 μm and perhaps the wafer thickness, depending on the application. Typically, PS region 106 may be in the range of 10–200 μm. Suitable anodization methods are known in the art. For example, the constant porosity may be in the range of 45–70% and the current density may be in the range of 30–100 mA/cm$^2$. The electrolyte may be a 49% HF plus a surfactant such as ethanol.

Figure 3I:
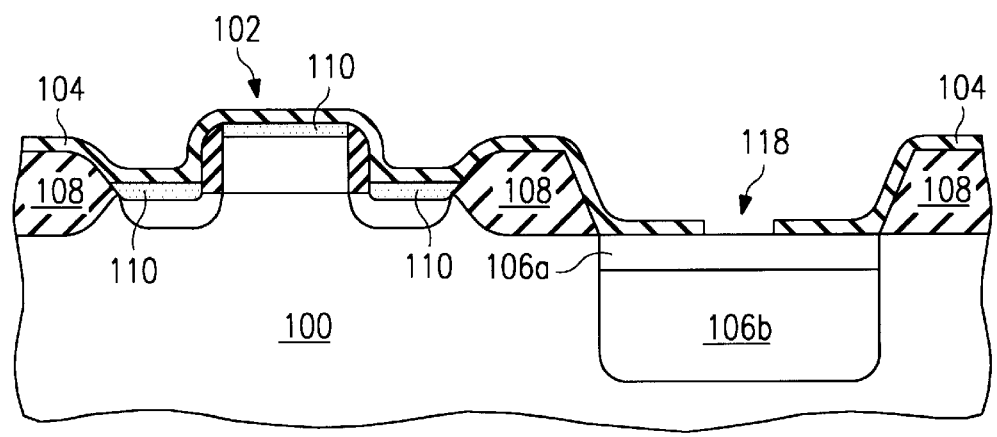

Alternatively, a two current step sequence may be used to form an upper PS layer 106a and a lower PS layer 106b, as shown in FIG. 3I. PS layer 106a may have a thickness in the range of 0.2–1 μm and a porosity in the range of 25–40%. This may be accomplished using a current density in the range of 1–5 mA/cm$^2$. PS layer 106b may then have a thickness in the range of 10 μm to perhaps the wafer thickness thick and a higher porosity in the range of 45–70%. This may be accomplished using a current density in the range of 30–100 mA/cm$^2$. The electrolyte may be the same in both cases: 49% HF+surfactant such as ethanol (approximately 50% solution of each).

If p− wafers are used, the anodization process may be performed while illuminating the back side of the wafers with above bandgap optical radiation. Exposing the wafers to light will reduce the resistivity of the Si.

After the formation of PS region 106, an poly-metal dielectric (PMD) 120 is deposited. PMD 120 typically comprises a PECVD TEOS. However, other PMD materials known in the art may alternatively be used as well as silicon nitride or SiC. If SiC is used, the process should also be a PECVD using trimethylsilane (or other organosilicon gas) and a Ar or He carrier gas @~5 Torr (gas flow 500–5000 sccm), RF power density ~2 W/cm$^2$ (13.56 MHz), Substrate temp 200–500° C.

Figure 3J:
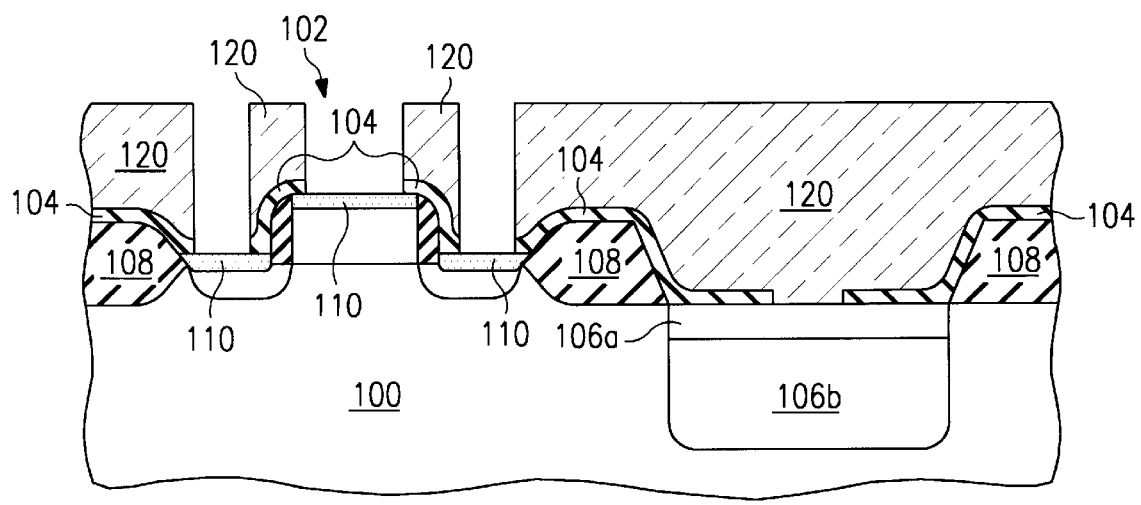

The PMD 120 is then patterned and a contact etch is performed to etch through the PMD 120, SiC masking layer 104 and the optional oxide layer if present down to the silicide 110, as shown in FIG. 3J. A multi-step etch is preferably used because an etch that will remove both SiC and SiO$_2$ will probably have poor selectivity between the dielectrics and the silicide, and most likely cut into the silicide. Without the multistep etch, poor process control may result.

Processing then continues to form metal interconnect layers and any passive components. In order to be isolated from the substrate, these passive components would be formed over PS regions 106.

A process for forming selective PS areas according to a second embodiment of the invention will now be discussed in further detail. In this embodiment, the SiC masking layer 104 is deposited after the transistor silicide process and is removed from the regions through which contacts will be made. As in the first embodiment, device is processed through isolation regions 108 and transistor 102 formation. Transistors 102 are fabricated through silicide 110 formation and anneal (Ti or W). Isolation regions 108 are shown as field oxide regions. However, there may alternatively be another type of isolation such as shallow trench isolation.

Figure 4A:
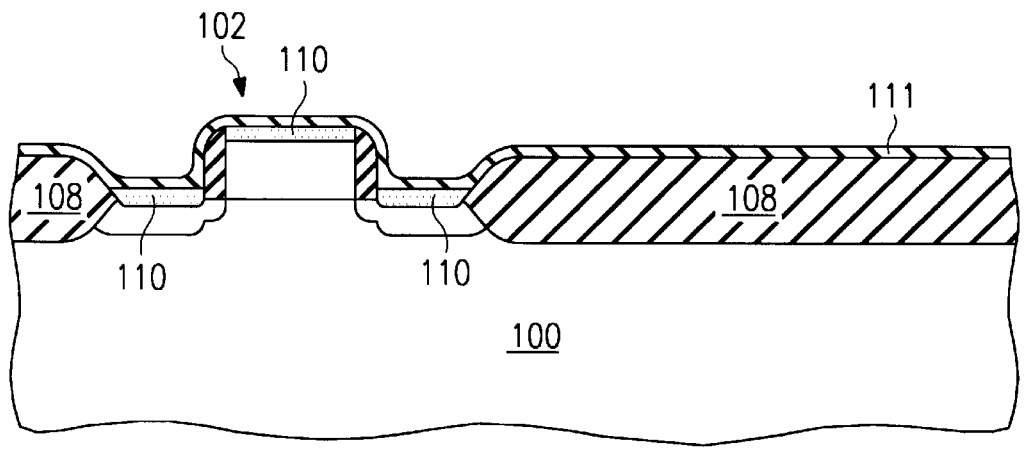
FIGS. 4A–4H are cross-sectional diagrams of a substrate having porous silicon areas according to a second embodiment of the invention at various stages of fabrication.

First, an oxide layer 111 is deposited as shown in FIG. 4A. In this embodiment, this oxide layer is not optional and must be present for the removal of SiC later in the process. This oxide layer may be deposited by, for example, PETEOS or LPCVD TEOS to a thickness on the order of 100 Å.

Figure 4B:
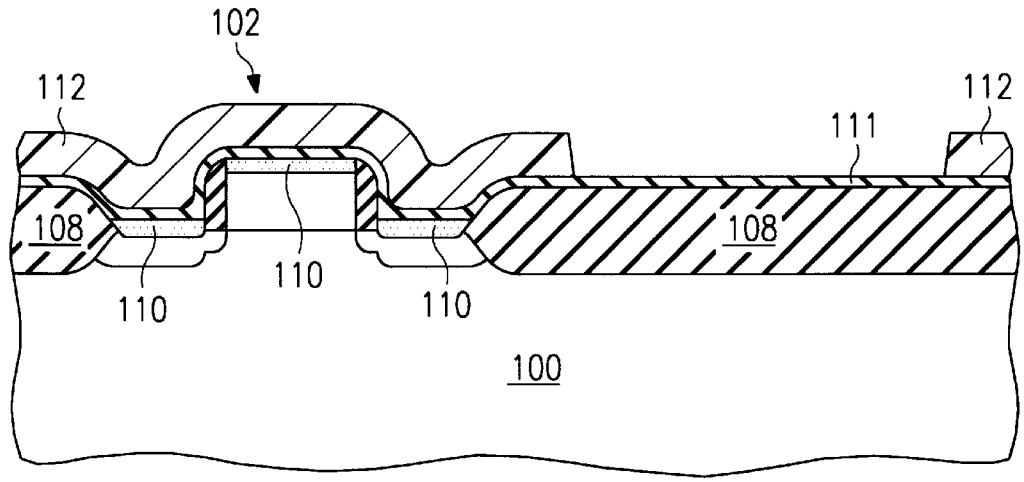
Figure 4C:
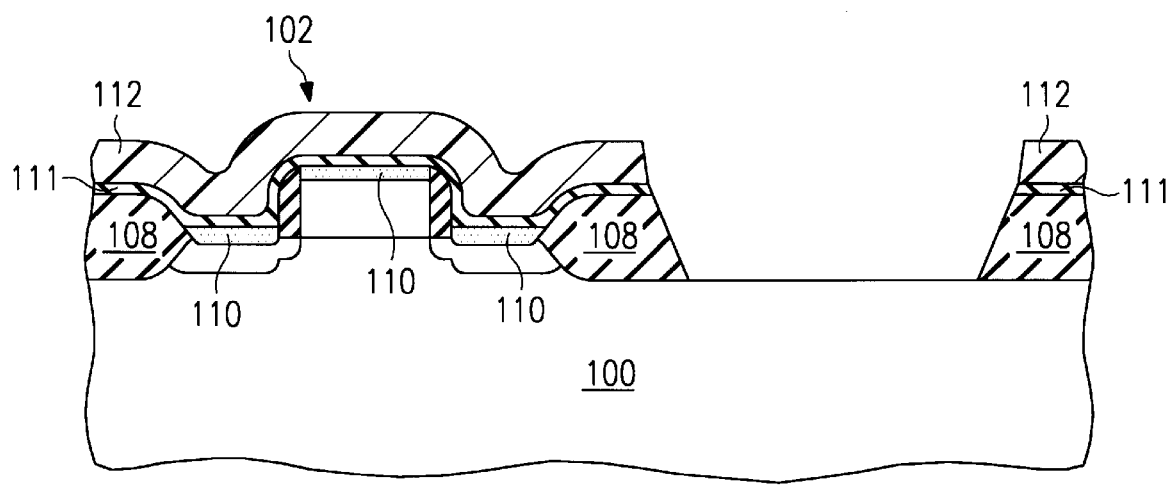

Next, a resist layer 112 is formed over the surface. The resist layer 112 is patterned as shown in FIG. 4B to expose an area 114 of isolation region 108. Area 114 is located over the desired PS site. Then, the oxide of isolation regions 108 is etched leaving sloped sidewalls on the order of 45°, as shown in FIG. 4C. This may, for example, be accomplished in one of the following two ways: (1) isotropic plasma etch using CF$_4$/O$_2$ or its equivalent or (2) HF deglaze. Resist layer 112 is then removed using standard ash/cleanup processes.

If p+ wafers with a p-epi layer are used, a p+ implant/diffusion step is needed prior to transistor formation to convert the p– epi to p+ resistivity on the order of 0.01 Ω-cm where porous silicon is desired. An deglaze/oxide etch may subsequently be performed to removed the dopant contaminated oxide and a pad oxide may be regrown to a thickness on the order of 100–500 Å.

Figure 4D:
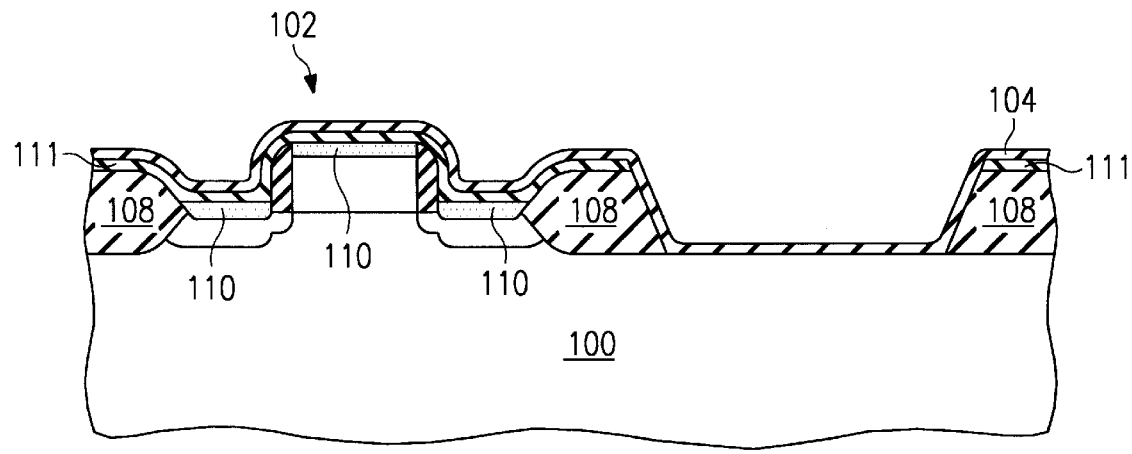

Referring to FIG. 4D, a masking layer 104 of a-SiC:H is deposited over the structure. Layer 104 may typically have a thickness in the range of 1000 Å to 5000 Å. The following process may be used: PECVD using trimethylsilane and Ar or He as canier gas. The pressure may be on the order of 5 Torr. The gas flow may be in the range of 500–2000 sccm. RF power density may be on the order of 2 W/cm$^2$ (13.56 MHz). The substrate temperature may be in the range of 200–500° C. If desired, a double deposition step (using the same conditions) may be used to reduce defects.

Figure 4E:
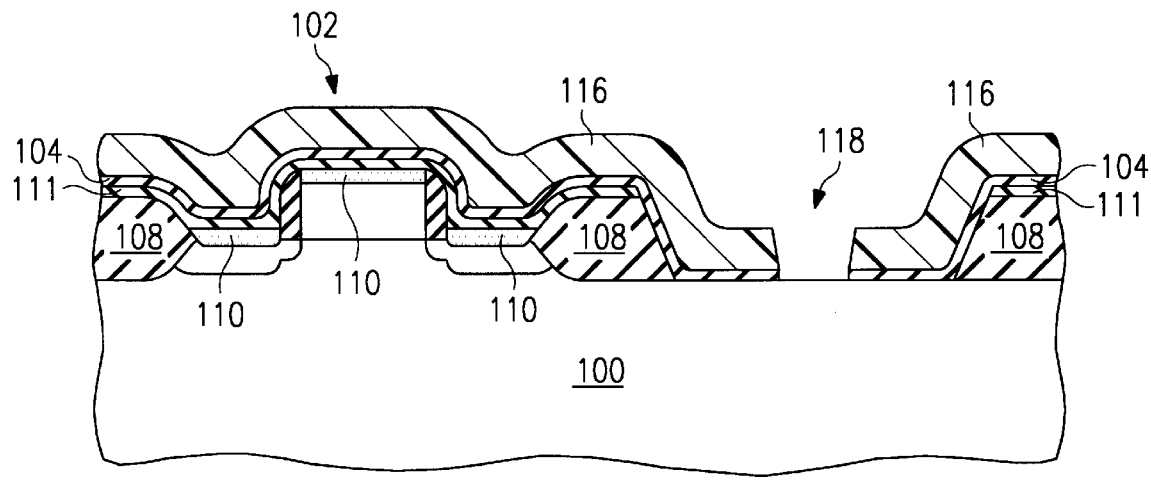

Next, a second resist mask 116 is formed over the SiC masking layer 104. Second resist mask 116 exposes a portion 118 of SiC masking layer 104 approximately in the center of where the PS region is desired, as shown in FIG. 4E. The exposed portion 118 is significantly smaller than the width of the desired PS region. The relationship between the size of portion 118 and the desired PS region is optimized based on the PS formation process parameters.

The exposed portion 118 of SiC masking layer 104 is removed. Methods for removing SiC are known in the art. The following are some exemplary methods for removing portion 118 of SiC masking layer 104. (1) Cl$_2$ based etch [Selectivity of the etch, with this gas, down to the oxide should not be an issue. Removal rate for SiC relative to SiO$_2$ of 10:1 has been achieved.] using a chamber pressure: ~300 mTorr (gas flow 10–50 sccm) and RF Power density ~0.5–1 W/cm$^2$ (13.56 MHz); (2) CF$_4$/O$_2$H$_2$ based etch using an O$_2$ fraction 0–90%, H$_2$ flow 0–20 sccm, (fluorinated-O$_2$ gas flow 10–50 sccm), chamber pressure; ~10–50 mTorr, and RF Power density ~0.5–1 W/cm$^2$ (13.56 MHz); (3) SF$_6$/O$_2$/H$_2$ based etch using O$_2$ fraction 0–90%, H$_2$ flow 0–20 sccm, (fluorinated-O$_2$ gas flow 10–50 sccm), chamber pressure; ~10–50 mTorr, and RF Power density ~0.5–1 W/cm$^2$ (13.56 MHz); and (4) CHF$_3$/CF$_4$/Ar/O$_2$/H$_2$ based etch using an O$_2$ fraction 0–50%, H$_2$ flow 0–100 sccm, (fluorinated-Ar gas flow 50–200 sccm), chamber pressure: ~10–50 mTorr, and RF Power density ~0.5–1 W/cm$^2$ (13.56 MHz). Second resist layer 118 is then removed.

Figure 4F:
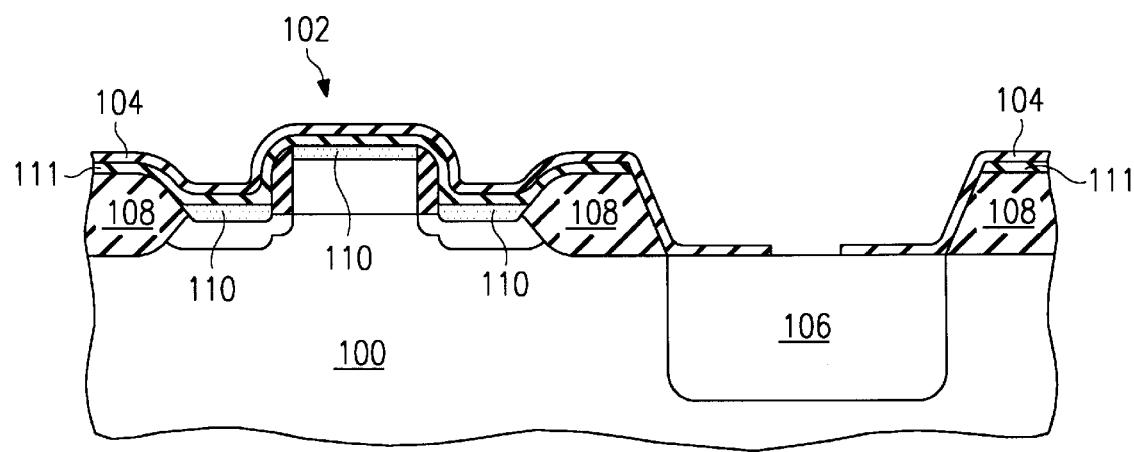

Next, the PS regions 106 are formed by anodization, as shown in FIG. 4F. The thickness of PS region 106 may vary between 10 μm and perhaps the wafer thickness, depending on the application. Typically, PS region 106 may be in the range of 10–200 μm. The constant porosity may be in the range of 45–70% and the current density may be in the range of 30–100 mA/cm$^2$. The electrolyte may be a 49% HF plus a surfactant such as ethanol.

Alternatively, a two current step sequence may be used to form an upper PS layer 106a and a lower PS layer 106b as in the first embodiment. PS layer 106a may have a thickness in the range of 0.2–1 μm and a porosity in the range of 25–40%. This may be accomplished using a current density in the range of 1–5 mA/cm$^2$. PS layer 106b may then have a thickness in the range of 10 μm to perhaps the wafer thickness thick and a higher porosity in the range of 45–70%. This may be accomplished using a current density in the range of 30–100 mA/cm$^2$. The electrolyte may be the same in both cases: 49% HF+surfactant such as ethanol (approximately 50% solution of each).

If p– wafers are used, the anodization process may be performed while illuminating the back side of the wafers with above bandgap optical radiation. Exposing the wafers to light will reduce the resistivity of the Si.

Figure 4G:
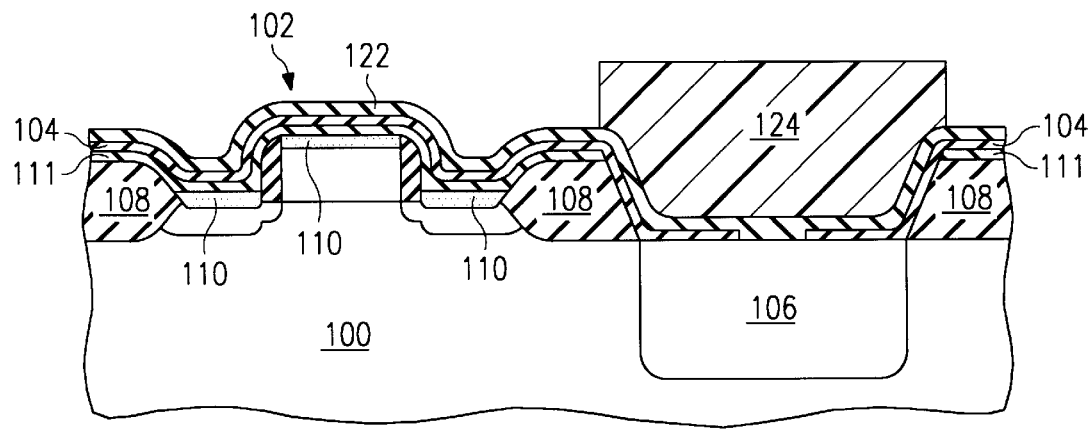

After the formation of PS region 106, the following optional sequence may be performed. First, a capping layer 122 may be deposited over the SiC masking layer 104, as shown in FIG. 4G. The capping layer may comprise SiC or silicon nitride and have a thickness on the order of 1500 Å. If SiC is used, the same deposition process should be used as earlier in the process. Second, a third resist mask 124 is then formed over capping layer 122 leaving the areas anodized covered and exposing the remaining areas.

Whether or not the above optional sequence is performed, the SiC masking layer 104 and capping layer 122 if present are etched stopping on oxide layer 111. If the optional third resist mask 124 is used, portions of SiC masking layer 104 will remain over the PS regions 106. Otherwise, the entirety of SiC masking layer 104 is removed. If present, the third resist mask is removed.

Figure 4H:
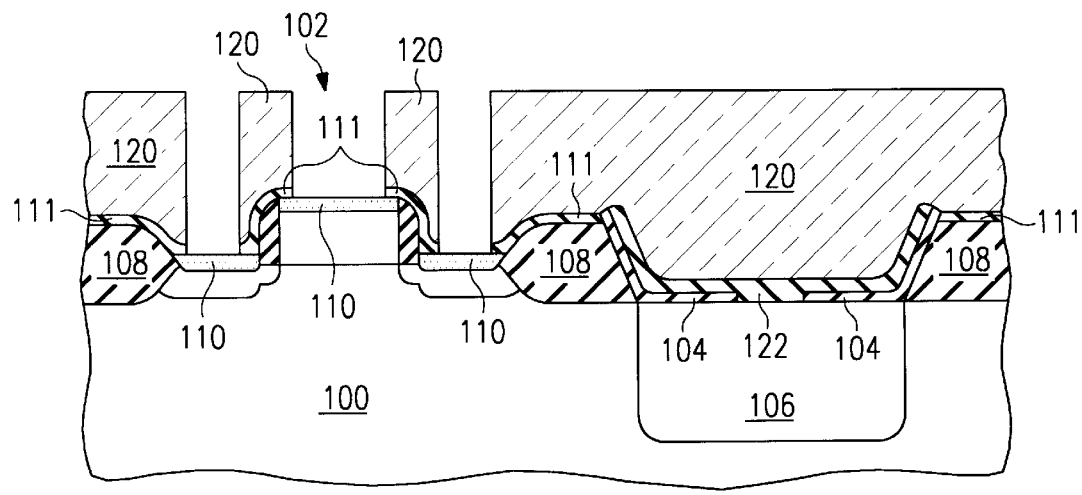

Next, PMD 120 is deposited. PMD 120 typically comprises a PECVD TEOS. However, other PMD materials known in the art may alternatively be used. The PMD 120 is then patterned and a contact etch is performed to etch through the PMD 120 and oxide layer 111 down to the silicide 110 as shown in FIG. 4H. In this embodiment a multi-step etch to account for removing SiC is not required. Processing then continues to form metal interconnect layers and any passive components. In order to be isolated from the substrate, these passive components would be formed over PS regions 106.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, while the low temperature aspect of the invention is especially advantageous after transistor fabrication, the process according to the invention may alternatively be performed (in whole or part) prior to transistor fabrication. A p+ diffusion of boron or similar dopant may be performed prior to the transistor formation to convert the p– epi to p+ w/resistivity on the order of 0.01 Ω-cm. If necessary, a deglaze to remove the boron or similar dopant contaminated oxide is then performed and a pad oxide is re-grown to a thickness on the order of 100–500 Å. It is therefore intended that the appended claims encompass any such modifications or embodiments.

What is claimed is:

1. A method of fabricating a porous silicon region in a substrate having a isolation region formed therein, comprising the steps of:
    patterning and etching said isolation region to expose a first area of said substrate;
    depositing, by plasma enhanced chemical vapor deposition using an organosilicon precursor gas, a layer of silicon carbide over said substrate including said first area, said depositing step occurring at a temperature in the range of 200–500° C.;
    patterning and etching said silicon carbide layer to expose a second area of said substrate within said first area; and
    forming a porous silicon region in said first area using an HF electrolyte, wherein said silicon carbide layer protects said transistor from the HF electrolyte.

2. The method of claim 1, wherein said organosilicon precursor gas comprises trimethylsilane.

3. The method of claim 1, wherein said step of patterning and etching said isolation region forms angled sidewalls having a slope on the order of 45°.

4. The method of claim 3, wherein said step of patterning and etching said isolation region comprises an isotropic plasma etch using $CF_4/O_2$.

5. The method of claim 3, wherein said step of patterning and etching said isolation region comprises an HF deglaze.

6. The method of claim 1, further comprising the step of forming an oxide layer over the substrate prior to said step of patterning and etching said isolation region.

7. The method of claim 1, wherein said silicon carbide layer has a thickness in the range of 1000–5000 Å.

8. The method of claim 1, wherein said step of depositing said silicon carbide layer has the following processing parameters: a carrier gas supplied at a pressure on the order of 4 Torr and a gas flow in the range of 500–5000 sccm, and a RF power density on the order of $2W/cm^2$ at a frequency on the order of 13.56 MHz.

9. The method of claim 1, wherein said step of patterning and etching said silicon carbide layer comprises the step of etching in chlorine with a chamber pressure on the order of 300 mTorr, a gas flow in the range of 10–50 sccm, and a RF power density in the range of 0.5–1 $W/cm^2$ at a frequency on the order of 13.56 MHz.

10. The method of claim 1, wherein said step of patterning and etching said silicon carbide layer comprises the step of etching in $CF_4/O_2/H_2$ with a chamber pressure on the order of 10–50 mTorr, a gas flow for $H_2$ in the range of 0–20 sccm and for fluorinated oxygen in the range of 10–50 sccm, and a RF power density in the range of 0.5–1 $W/cm^2$ at a frequency on the order of 13.56 MHz.

11. The method of claim 1, wherein said step of patterning and etching said silicon carbide layer comprises the step of etching in $SF_6/O_2/H_2$ with a chamber pressure on the order of 10–50 mTorr, a gas flow for $H_2$ in the range of 0–20 sccm and for fluorinated oxygen in the range of 10–50 sccm and a RF power density in the range of 0.5–1 $W/cm^2$ at a frequency on the order of 13.56 MHZ.

12. The method of claim 1, wherein said step of patterning and etching said silicon carbide layer comprises the step of etching in $CHF_3/CF_4/Ar/O_2/H_2$ with a chamber pressure on the order of 10–50 mTorr, a gas flow for $H_2$ in the range of 0–100 sccm and for fluorinated argon in the range of 50–200 sccm, and a RF power density in the range of 0.5–1 $W/cm^2$ at a frequency on the order of 13.56 MHZ.

13. The method of claim 1, wherein said step of forming said porous silicon region comprises anodization in a HF electrolyte and a current density in the range of 30–100 $mA/cm^2$.

14. The method of claim 1, wherein said step of forming said porous silicon region comprises a two-step anodization process, wherein the first step occurs at a current density in the range of 1–5 $mA/cm^2$ and the second step occurs at a current density in the range of 30–100 $mA/cm^2$.

15. The method of claim 3, further comprising the steps of:
    forming a silicon carbide capping layer after said step of forming said porous silicon region;
    patterning said silicon carbide capping layer to cover a region of said porous silicon region and exposing the remaining portions of said silicon carbide capping layer; and
    removing the exposed portions of said silicon carbide capping layer and silicon carbide masking layer.

16. The method of claim 1, further comprising the steps of:
    diffusing a p-type dopant into said first area prior to said step of depositing said silicon carbide; and
    after said diffusion step, forming a transistor in said substrate.

17. A method of fabricating an integrated circuit having active components and at least one passive RF component, comprising the steps of:
    forming isolation regions in a substrate;
    forming said active components in said substrate;
    patterning and etching at least one of said isolation regions to expose a first area of said substrate;
    depositing, by plasma enhanced chemical vapor deposition using an organosilicon precursor gas, a layer of silicon carbide over said substrate including said first area, said depositing step occurring at a temperature in the range of 200–500° C.;

patterning and etching said silicon carbide layer to expose a second area of said substrate within said first area;

forming a porous silicon region in said first area using an HF electrolyte, wherein said silicon carbide layer protects said transistor from the HF electrolyte;

forming an interlevel dielectric layer over said silicon carbide layer;

etching contact holes in said interlevel dielectric layer to said active components;

forming metal interconnect layers over said interlevel dielectric layer; and forming said at least one passive component over said porous silicon region.

18. The method of claim 17, wherein said organosilicon precursor gas comprises trimethylsilane.

19. The method of claim 17, wherein said silicon carbide layer has a thickness in the range of 1000–5000 Å.

20. The method of claim 17, wherein said step of depositing said silicon carbide layer has the following processing parameters: a carrier gas supplied at a pressure on the order of 5 Torr and a gas flow in the range of 500–5000 sccm, and a RF power density on the order of $2W/cm^2$ at a frequency on the order of 13.56 MHz.

21. The method of claim 17, wherein said step of forming said porous silicon region comprises anodization in a HF electrolyte and a current density in the range of 30–100 $mA/cm^2$.

22. The method of claim 17, wherein said step of forming said porous silicon region comprises a two-step anodization process, wherein the first step occurs at a current density in the range of 1–5 $mA/cm^2$ and the second step occurs at a current density in the range of 30–100 $mA/cm^2$.

23. The method of claim 17, wherein said step of depositing said silicon carbide layer comprises dual deposition steps.

24. The method of claim 17, wherein said step of forming said active components occurs after said step of patterning and etching at least one of the isolation regions, and further comprising the step of:

diffusing a p-type dopant into said first area prior to said steps of forming the active components and depositing said layer of silicon carbide.

* * * * *